United States Patent [19]

Stanley et al.

[11] Patent Number: 4,884,228

[45] Date of Patent: Nov. 28, 1989

[54] FLEXIBLE INSTRUMENT CONTROL SYSTEM

[75] Inventors: James C. Stanley, Portland; Brian D. Diehm, Lake Oswego, both of Oreg.

[73] Assignee: Tektronix, Inc., Beaverton, Oreg.

[21] Appl. No.: 918,430

[22] Filed: Oct. 14, 1986

[51] Int. Cl.⁴ .................. G06F 15/20; G05B 23/02
[52] U.S. Cl. .................... 364/579; 364/200;
364/221.7; 364/232.9; 364/242.7; 364/245.6;
364/481; 324/73 A T
[58] Field of Search ... 364/200 MS File, 900 MS File,
364/481, 483, 487, 579; 324/73 A T

[56] References Cited

U.S. PATENT DOCUMENTS

| T920,008 | 3/1974 | Broadwell et al. | 364/200 |
| 3,400,374 | 9/1968 | Schumann | 364/200 |
| 3,702,986 | 11/1972 | Taylor et al. | 364/200 |
| 3,882,305 | 5/1975 | Johnstone | 364/551 |
| 4,068,297 | 1/1978 | Komiya | 364/107 |
| 4,104,725 | 8/1978 | Rose et al. | 364/487 |
| 4,138,718 | 2/1979 | Toke et al. | 364/200 |
| 4,399,502 | 8/1983 | MacDonald et al. | 364/189 |
| 4,525,673 | 6/1985 | Berkowitz | 324/312 |
| 4,630,224 | 12/1986 | Sollman | 364/550 |
| 4,758,963 | 7/1988 | Gordon et al. | 364/481 |

Primary Examiner—Eddie P. Chan
Assistant Examiner—Christina M. Eakman
Attorney, Agent, or Firm—John P. Dellett; Francis I. Gray

[57] ABSTRACT

Operation of a microcomputer-based instrument is controlled by software including a control interface system, a command execution system, and a steady state system. The steady state system includes a group of subsystems operating as concurrent tasks, each carrying out various instrument operations. The control interface system includes a set of subsystems, each responsive to configuration control input signals from a separate control signal source, and each converting configuration control signals into "configuration commands". Each command identifies a particular procedure for configuring the operating state of one or more instrument hardware or software steady state subsystems of the instrument. Each command is stored in memory in one of several queues (one for each control interface subsystem) until the procedure it invokes is carried out. The command execution system includes an arbitrator routine which selects commands stored in the queues according to a predetermined priority scheme and invokes command execution subroutines for carrying out procedures identified by the selected commands. When a command execution subroutine is invoked, it reconfigures one or more instrument hardware or software subsystems according to configuration parameters included in the command.

6 Claims, 4 Drawing Sheets

FLEXIBLE INSTRUMENT CONTROL SYSTEM

BACKGROUND OF THE INVENTION

The present invention relates in general to computer-based instrumentation systems and in particular to an easily modifiable system for configuring the operating state of a computer-based instrumentation system according to control signals generated by many independent control sources.

Microcomputers have expanded the capabilities of oscilloscopes, logic analyzers and similar instruments in many ways. For example, in addition to performing the traditional oscilloscope function of displaying representations of waveform produced by devices under test, microcomputer-based oscilloscopes can perform measurements on waveforms and display the results, can generate and display synthesized waveforms, and can perform self-calibration and self-diagnosis operations. Microcomputers have also made complicated oscilloscopes more "user friendly" by facilitating the use of interactive menus to simplify the process of configuring an oscilloscope to carry out selected operations, and by facilitating the display of graphics, data, messages and other information enabling operators to more easily determine the operating state of an oscilloscope and to understand the results of oscilloscope operation.

Computer-based instrumentation systems such as oscilloscopes and the like often comprise a number of interactive hardware and software subsystems, each subsystem being adapted to carry out some function of the instrument and each having various configurable operating modes. In a digitizing oscilloscope, hardware subsystems may include one or more vertical input channels, a digitizer system, a waveform data storage system, a display system, and other hardware subsystems each of which has adjustable modes of operation. For example, vertical input channels typically have adjustable gain, offset and other configurable operating parameters, and the digitizer system may have selectable triggering modes, variable sampling rates, etc. Oscilloscope software subsystems may include routines for calculating and displaying synthesized waveforms based on acquired data, routines for calculating and displaying signal peaks, rise times and other measurable attributes which can be determined from digitized waveform data, and routines for performing other functions.

In addition to having multiple subsystems for carrying out operations in various configurable operating modes, a computer-based oscilloscope can provide several different ways for an operator to control the configuration of the subsystems. For example, an oscilloscope may permit an operator to adjust instrument operating modes by utilizing pushbuttons and knobs mounted on the oscilloscope front panel, by making selections from menus displayed on the screen, or by utilizing a keyboard attached to the oscilloscope. Some oscilloscopes may further include provisions for configuration-control data input from external computers by way of data buses.

Many modern oscilloscopes are designed to be expandable so that as additional hardware and software subsystems are created, the new subsystems may be incorporated into existing oscilloscopes. Hardware subsystem additions are often accommodated by providing spare "slots" in an oscilloscope mainframe into which new circuit boards containing the additional hardware can be inserted. Software changes are often accomplished by replacing read only memories (ROMs) storing existing system software with ROMs including new software. (Program instructions stored in ROMs are sometimes referred to as "firmware" rather than "software", but herein the term "software" is intended to apply to all forms of computer program instructions.) However, addition of new hardware of software subsystems often necessitates rewriting of extensive portions of preexisting software to insure the new subsystem interacts properly with existing subsystems, and to provide for configuration control over the new subsystem through the existing means of configuration control. What is needed is a configuration control system for a computer-based instrument which permits addition or modification of hardware and software subsystems of the instrument without requiring modification of extensive portions of existing software.

SUMMARY OF THE INVENTION

In accordance with the present invention, operating modes of a microcomputer-based instrument are configured by software organized into an operating system, a control interface system, a command execution system, an interboard communication system, and a steady state system. The operating system provides random access memory management, multi-tasking, and other typical operating system functions. The interboard communication system includes subsystems operating as routines within an operating environment provided by the operating system which enable communication between the instrument microcomputer and other hardware subsystems. The steady state system includes a group of subsystems operating as tasks within the operating system environment, and each steady state subsystem may be configured to carry out various software-based operations of the instrument. For example in an instrument such as an oscilloscope, steady state subsystem operations may include synthesis of waveform data, determination of waveform attributes such as peaks, rise times and the like, control of waveform and graphics displays, etc.

The control interface system also includes a set of subsystems operating as tasks within the operating system environment and each control interface subsystem is responsive to configuration control input signals from a separate source. For example in an oscilloscope, control input signals may be provided by knobs, pushbuttons and/or touch screens on the instrument front panel, by a keyboard, or by an external computer connected to the oscilloscope through external buses. Each subsystem of the control interface system converts its input control signals into "configuration commands", each command identifying a particular procedure for configuring one or more subsystems of the instrument according to a block of configuration parameters included in the command. The operating system stores commands produced by each control interface subsystem in a corresponding queue until the procedure that it invokes is carried out, one such queue being provided for each control interface subsystem.

The command execution system includes a set of command execution subroutines (modules), one corresponding to each procedure indentified by a command and adapted to carry out such procedure when invoked. The command execution system further includes an arbitrator subroutine which selects command stored in the queues according to a predetermined priority scheme and invokes the command execution module corresponding to the procedure identified by the selected command. When a command execution module is invoked, the module reconfigures one or more selected hardware subsystems by transmitting configuration control signals or messages to the hardware systems by way of the interboard communication system and/or reconfigures one or more selected software steady state subsystems by way of control data passed thereto.

The present invention provides a flexible software architecture for a computer-based instrument permitting modification or addition of hardware and steady state software subsystems of the instrument without extensive modifications to preexisting configuration control software. For example, to add a new configuration control signal source, it is necessary only to add one additional control interface subsystem for producing configuration commands in response to signals from the new control signal source and to adjust the arbitrator so that it includes commands from the new control interface subsystem in its arbitration scheme. It is unnecessary to make changes to any other portion of the configuration control software. When a new hardware or steady state software subsystem is added, one or more of the existing command execution modules may be modified to control configuration of the new subsystem. Alternatively a new command execution module for configuring the new subsystem may be added without changing any pre-existing command execution module.

It is accordingly an object of the present invention to provide an improved control system for a computer-based instrument which permits easy addition and modification of hardware and software subsystems without requiring extensive modification to pre-existing software.

The subject matter of the present invention is particularly pointed out and distinctly claimed in the concluding portion of this specification. However, both the organization and method of operation of the invention, together with further advantages and objects thereof, will best be understood by reference to the following description taken in connection with accompanying drawings.

DRAWINGS

DETAILED DESCRIPTION

Figure 1:
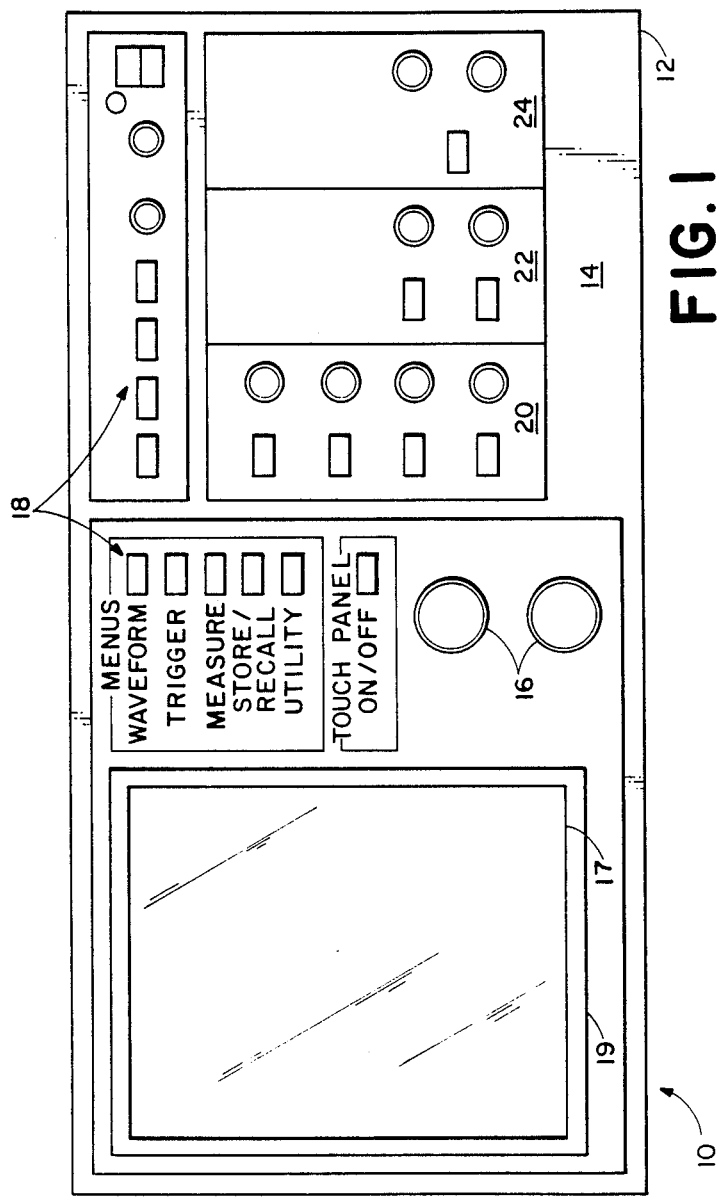
FIG. 1 is a front elevation view of an oscilloscope utilizing the present invention.

The present invention relates to an improved software architecture for computer-based instrumentation systems such as oscilloscopes, logic analyzers and the like, of the type having numerous hardware and software subsystems for carrying out various instrument operations. Referring to FIG. 1, a front elevation view of an example of one such instrumentation system, a microcomputer-based digitizing oscilloscope 10, is depicted. Oscilloscope 10 includes a main chassis 12, a front panel 14 mounted on the chassis, knobs 16, a screen 17 and pushbuttons 18 mounted on the front panel, as well as a set of three "plugins" 20, 22 and 24. Each plugin comprises a hardware subsystem of the oscilloscope mounted on a small, removable chassis "plugged" into main chassis 12 through a corresponding slot in front panel 14. The plugin hardware subsystems, interconnected with other hardware within chassis 12 through backplane wiring in chassis 12, may include vertical channel amplifiers, trigger systems and other equipment. Each plugin includes an individual front panel on which additional pushbuttons, control knobs and jacks needed for instrument control and input may be mounted. The screen 17 is adapted to display waveforms, menus, data and other graphics and text produced by the oscilloscope and includes a wellknown "touch screen" 19 mechanism comprising rows of light sources and light sensors distributed around the edge of the screen providing control input signals to the oscilloscope indicating locations on the screen touched by an operator's finger. The touch screen 19 is used primarily to permit an operator to make selections from menus displayed on the screen. Oscilloscopes of this type operate in a known manner.

Figure 2:
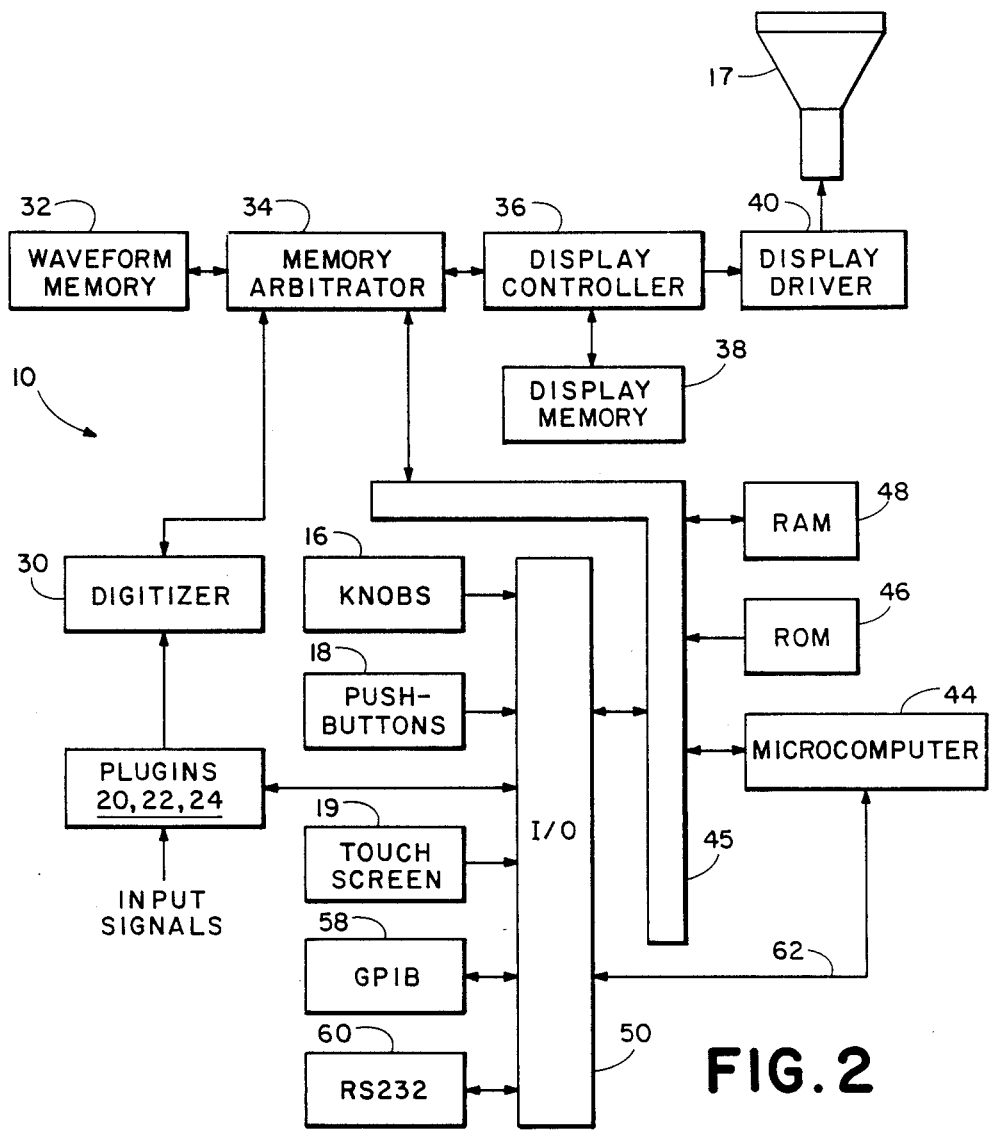
FIG. 2 is a block diagram of hardware associated with the oscilloscope of FIG. 1.

FIG. 2 is a block diagram of hardware associated with the oscilloscope 10 of FIG. 1. Signals produced by devices under test and applied as input to oscilloscope 10 through jacks in plugins 20, 22 and 24 are preconditioned by the plugins and applied as waveform and triggering inputs to a digitizer 30. The digitizer 30 digitizes selected input signals to produce sequences of waveform data representing the magnitude of successive waveform samples, and transmits these waveform data sequences for storage in a waveform memory 32 by way of a memory arbitrator 34 which arbitrates competing demands for access to the waveform memory 32. Through memory arbitrator 34, a display controller 36 acquires selected waveform data sequences stored in waveform memory 32 and utilizes these sequences to create a bit map of an oscilloscope display, the bit map being stored in a display memory 38. The display controller 36 periodically acquires bit map information from the display memory 38 and transmits it to a display driver 40 which produces a display on the cathode ray tube screen 17 of the oscilloscope 10 according to bit map data.

The memory arbitrator 34 also provides microcomputer 44 with read and write access to waveform memory 32 by way of a computer bus 45 including control, data and address lines. Microcomputer 44 suitably comprises an Intel model 80286 microprocessor and may include an Intel 80287 arithmetic coprocessor for performing fast arithmetic operations and an Intel 82258 direct memory access (DMA) controller for fast I/O operations. The microcomputer 44, operating under control of software (sometimes called "firmware") stored in a read only memory (ROM) 46, may be programmed to carry out a number of functions including, for example, the control of operating states of plugins 20, 22 and 24, digitizer 30, and display controller 36. The microcomputer 44 provides control input signals to plugins 20, 22, and 24 through bus 45 to which the plugins are connected by means of suitable bus input/output (I/O) interface circuitry 50. Microcomputer 44 also controls digitizer 30 operating modes through commands sent over bus 45 and stored in waveform memory 32 by way of memory arbitrator 34, the stored commands being subsequently read out of memory 32 by digitizer 30. Microcomputer 44 determines which stored waveform data sequences display controller 36 is to display by sending commands to memory arbitrator 34 telling it to obtain selected waveform sequences from memory and to transmit them to the display controller 36. Microcomputer 44 also controls the display of menus, graphics and data on screen 17 by storing data in waveform memory 32 and commanding arbitrator 34 to forward that data to the display controller 36.

Input signals, produced by operation of the oscilloscope main front panel knobs 16 and pushbuttons 18, by operation of knobs, pushbuttons or switches on the individual front panels of plugins 20, 22, or 24, and by operation of the touch screen 19, are sensed by the I/O circuitry 50 which transmits messages to microcomputer 44 in response thereto. In response to the messages, microcomputer 44 configures various subsystems of the oscilloscope for selected modes of operation. The I/O circuitry 50 also provides an interface between bus 45 and two external buses, a general purpose interface bus (GPIB) 58 and an RS232 bus 60, buses 58 and 60 being accessible through pin conductors at the rear of the oscilloscope chassis. Buses 58 and 60 provide a path for communication between the oscilloscope 10 and external equipment such as a remote computer. A remote computer way, for example, provide control signals over bus 58 or bus 60 for configuring the oscilloscope 10 for carrying out selected operations and for obtaining through bus 58 or bus 60 test data acquired by oscilloscope 10 in the course of carrying out such operations. The I/O circuitry 50 converts ASCII messages transmitted on buses 58 or 60 to ASCCII messages sent to microcomputer 44 and converts ASCII messages from microcomputer 44 to ASCII messages for transmission over buses 58 or 60. The I/O circuitry 50 also permits external equipment connected to the oscilloscope through buses 58 or 60 to access interrupt and direct memory access control lines 62 of microcomputer 44 so that the external equipment can interrupt microcomputer 44 and/or gain direct memory access to RAM 48.

The microcomputer 44 may be programmed to carry out a number of operations involving computations. For example, the microcomputer may acquire one or more digital waveform data sequences from waveform memory 32, combine the data sequences according to a user-defined mathematical expression to produce a "synthesized" waveform data sequence, store and synthesized data sequence in waveform memory 32, and then cause display controller 36 to display a synthesized waveform described by the stored data sequence. The synthesized waveform might, for example, represent the sum of two digitized input waveforms also displayed on the screen, the integral of a digitized input waveform, or any other function of a waveform. The microcomputer 44 can also calculate synthesized waveform data on the basis of a user-defined mathematical expression which does not operate on data from waveform memory 32. For example, the microcomputer may calculate waveform data representing a simple sine wave or square wave and store that data in waveform memory 32 for subsequent use in creating a waveform display. The microcomputer 44 may also be programmed to enable the oscilloscope to perform various "measurements" on waveform data sequences stored in memory 32 such as, for example, determining the peak or RMS values of an input signal represented by the digitized waveform data, the results being displayed on screen 17.

The hardware architecture of FIG. 2, particularly the use of plugins, allows hardware subsystems to be added, removed, or modified with little or no change to the oscilloscope chassis or other hardware subsystems of the oscilloscope. Various software controlled operations of the oscilloscope can be added or changed by replacing ROM 46 with a new ROM containing different software (firmware). The hardware architecture of FIG. 2 permits the response of the oscilloscope to operation of knobs, pushbuttons and touch screen inputs to be determined by software rather than by hardwired connections and this enables oscilloscope response to a signal from one of these input sources to be changed "on the fly" so that any particular input signal source may control more than one oscilloscope operating parameter. For example, in one operating state the oscilloscope may determine and display data representing the magnitude of a displayed waveform at a point along the waveform indicated by a cursor on the screen, and one of the knobs 16 of FIG. 1 may control the position of that cursor. In another oscilloscope operating state, the same knob 16 may be utilized to set the value of a parameter controlling trigger delay. As another example, the effect of an operator touching a point on screen 17 may vary depending on which of several menus may be displayed on the screen.

Figure 3:
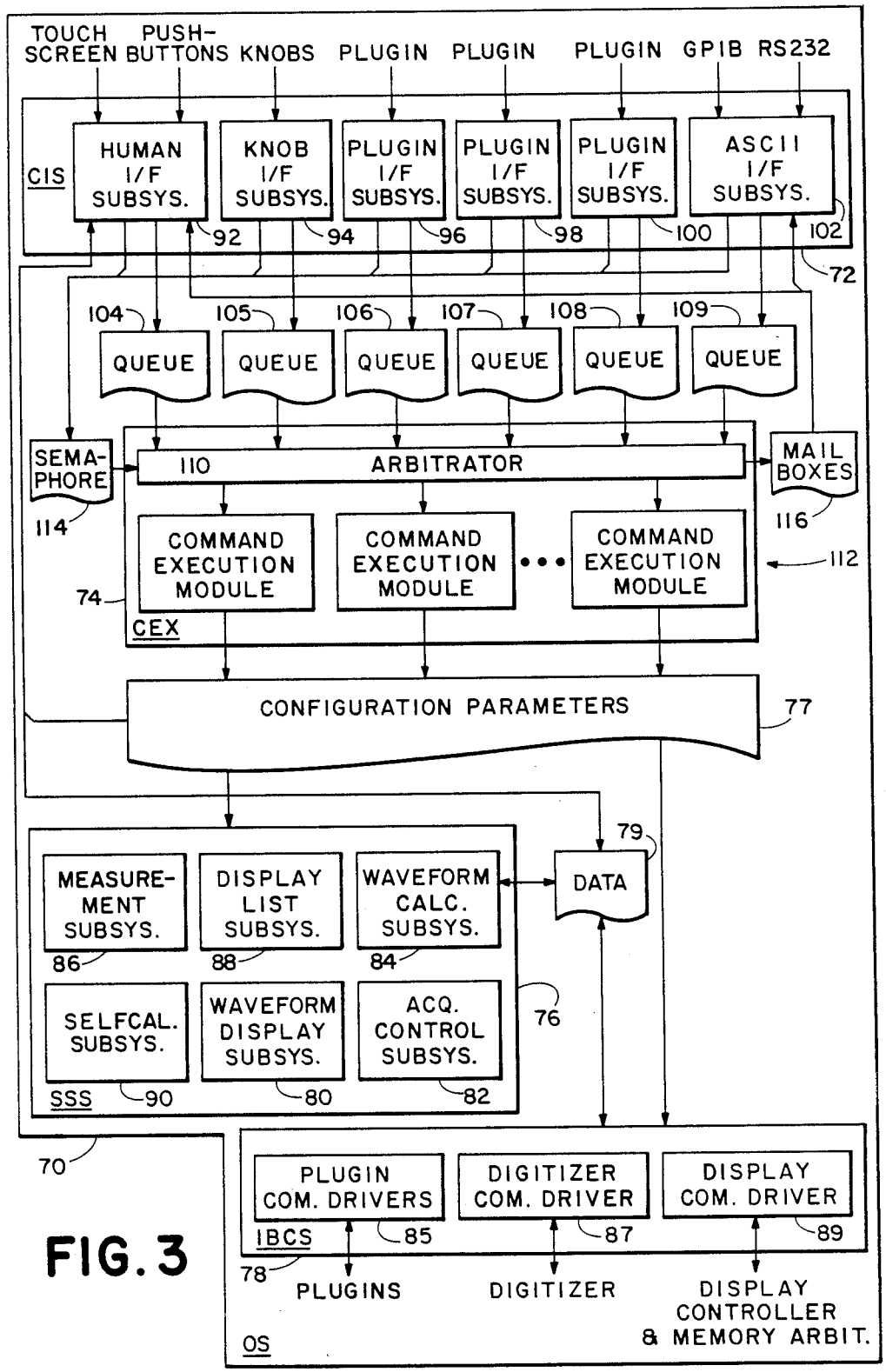
FIG. 3 is a data flow diagram showing interaction of software systems controlling the oscilloscope of FIGS. 1 and 2 according to the present invention.

According to the present invention, software in ROM 46 for controlling the configuration and steady state operation of the oscilloscope is organized in a flexible software architecture which accommodates changes in hardware and software-based oscilloscope operations without extensive modification of preexisting software. Referring to FIG. 3, depicting the software architecture in data flow diagram form, oscilloscope software is organized into an operating system (OS) 70, a control interface system (CIS) 72, a command execution system (CEX) 74, a steady state system (SSS) 76, and an interboard communication system (IBCS) 78. The control interface system 72, command execution system 74, steady state system 76 and interboard communication system 78 each comprise tasks which run within an operating environment provided by the operating system 70, and the operating system multiplexes the microcomputer through these tasks on a "time slice" basis so that tasks run in a substantially "concurrent" fashion. The operating system 70 also manages allocation of storage space in random access memory 48 of FIG. 2, synchronizes access to common data structures by the various tasks to provide task-to-task communication, provides I/O interfacing, and maintains a set of timers for controlling periodic activities.

The steady state system 76 includes a set of software subsystems running as concurrent tasks within the operating system 70, each subsystem operating in a mode set according to the values of one or more "configuration parameters" 77 stored in RAM 48 of FIG. 2. A waveform display subsystem 80 controls the transfer of waveform data from the waveform memory 32 to the display controller 36 of FIG. 2. The digitizer 30 of FIG. 2 includes an internal computer which may be programmed to stop digitizing a particular input waveform and to transmit an "acquisition stopped" message to microcomputer 44 when predetermined conditions (such as for example receipt of a given number of triggers) have been fulfilled. An acquisition control subsystem 82 of the steady state system 76 of FIG. 3 responds to the "acquisition stopped" message by executing a routine which may be configured to cause the newly acquired waveform data to be displayed on the screen. A waveform calculation subsystem 84 calculates the previously mentioned synthesized waveform data according to user-defined expressions, and a measurement subsystem 86 determines attributes of selected input waveforms (such as peak values, rise times, etc.) from the digitized input waveform data stored in the waveform memory. A display list subsystem 88 controls the display of the results of measurements performed by the measurement subsystem 86, and controls the positioning of graphical elements such as cursors and icons on the screen. A self-calibration subsystem 90 periodically initiates commands to the oscilloscope digitizer and plugins which cause them to self-calibrate.

All of the above-described subsystems of the steady state system 76 are tasks which typically run continuously during normal "steady state" oscilloscope operation, and most of these tasks can be "configured" to perform their functions in a variety of ways be setting the values of various oscilloscope operating state configuration parameters 77. For example, the waveform calculation subsystem 84 can be configured to simultaneously calculate from 1 to 8 waveform data sequences, and the expression controlling calculation of each sequence may be changed by a user. Once a subsystem of steady state system 76 is configured to operate in a particular manner, the subsystem continues to operate in such manner until it is reconfigured by changing the values of appropriate configuration parameters 77.

The digitizer, display controller and plugin hardware subsystems each may also be configured according to various configuration parameters 77 to operate in a particular "steady state" mode of operation and will continue to operate in such mode until the configuration parameters controlling subsystem operation are changed. For example the digitizer may be configured to digitize a particular set of input waveforms utilizing triggering events, sampling rates and other controllable operating conditions determined by input configuration data, and will continue to do so until the digitizer is supplied with new configuration control data which changes some aspect of its operation.

The interboard communication system 78 comprises drivers for providing for communication between the microcomputer 44 and various hardware subsystems of the oscilloscope, including a set of drivers 85 for handling communication with the plugins, a driver 87 for handling communication with the digitizer, and a driver 89 for handling communication with the display controller. The drivers are utilized to transmit configuration control commands to the hardware subsystem when values of configuration parameters 77 affecting operation of these subsystems change. The drivers are also utilized to transmit data between hardware and software subsystems. Data including waveform data sequences, calculation results, messages and the like, are passed between the hardware and software subsystems by storing the data in files 79 in RAM 48 accessed by the drivers in the interboard communication system 78 and software subsystems.

The operating state of each software subsystem of steady state system 76, as well as the operating state of each hardware plugin, digitizer and display controller subsystem, may be configured by an operator utilizing the touch screen, knobs or pushbuttons on the oscilloscope main front panel, or by a remote control system such as an external computer utilizing data transmitted over the GPIB or RS232 buses. As discussed hereinabove, the I/O circuitry 50 of FIG. 2 transmits messages to the microcomputer 44 in response to control signals or messages from these sources. The control interface system 72 of FIG. 3 provides a set of interface subsystems operating as tasks within operating system 70, and each subsystem is adapted to respond to messages produced by the I/O circuitry 50 by generating a predetermined "configuration command". Each configuration command invokes a procedure for changing the value of one or more configuration parameters 77 so as to reconfigure one or more of the subsystems of the steady state system 76 and/or one or more of the oscilloscope hardware subsystems for selected modes of operation. Each command also conveys a block of "configuration data" utilized by the invoked procedure when setting the values of the configuration parameters 77.

A human interface management subsystem 92 of control interface system 72 manages the display of menus on the oscilloscope screen and also produces configuration commands in response to messages from interface circuitry 50 indicating touch screen 19 menu selections or indicating operation of oscilloscope front panel pushbuttons 18 of FIG. 1. A knob interface subsystem 94 produces configuration commands in response to messages from the I/O circuitry indicating the direction and amount of rotation of either one of the two front panel knobs 16 of FIG. 1. A set of three plugin interface subsystems 96, 98 and 100 produce configuration commands in response to I/O interface circuitry messages indicating operation of knobs or pushbuttons on the plugins 20, 22 and 24 of FIG. 1, and an "ASCII" interface subsystem 102 produces configuration commands in response to messages from the I/O interface circuitry based on messages carried over the GPIB and RS232 buses. Operating system 70 stores the configuration commands produced by interface subsystems 92, 94, 96, 98, 100, and 102 of control interface system 72 in RAM 48 of FIG. 2 in the form of data queues 104-109, respectively, and each command remains stored in a queue until executed.

Each configuration command comprises a block of data structured in a similar fashion, including the data fields as shown in Table I below:

TABLE I

| Field-Name | Field-Length | Parameter-Type | Function |
|---|---|---|---|
| errorMb | 16 bits | boolean | return error message |
| doneSem | 16 bit | boolean | return done semaphore |
| cmdId | 16 bit | integer | command ID |
| key | 16 bit | integer | trace number |
| enumArg | 16 bit | boolean | any purpose |
| si | 16 bit | signed int. | any purpose |
| ui(3) | 3 × 16 bit | 3 integers | any purpose |
| nrx | 64 bit | flt. pt. | any purpose |
| slot | 16 bit | integer | slot ID |
| data | 32 bit | pointer | pointer to data |
| len | 16 bit | integer | length of data |

Although each command includes each of the data fields listed in Table I, a procedure invoked by any particular command may not utilize data contained in every field. The error Mb and doneSem fields contain data indicating whether the control interface subsystem producing the command wants the command execution system 74 to return error messages or a "done semaphore" (as described hereinbelow) in the course of executing a command. Data in the cmdid field identifies the procedure to be invoked by the command. The key field is used to identify a particular waveform data base element (e.g. waveform trace) in commands affecting waveform displays, such as, for example, a command to cease displaying a waveform. The enumArg, si, ui, and nrx fields convey various types of parameters (booleans, signed and unsigned integers and floating point numbers) which may describe some particular feature of subsystem configuration depending on the nature of the procedure being invoked. For example, in a command to change the background intensity of the display in response to knob rotation, the intensity may be increased or decreased according to the value of data in the si field, and most of the other fields may be unused.

The slot field listed in Table 1 contains an integer whose value identifies a particular plugin, and this field is used in commands which affect plugins. The data field is a pointer to an initial location in RAM 48 of FIG. 2 where a block of data is stored and the len field indicates the number of memory addresses the block of data consumes. The data and len fields are used in commands invoking procedures requiring large blocks of input data. For example, when the human interface management subsystem 92 produces a command which invokes a procedure for configuring the waveform calculation subsystem 84 so as to calculate a waveform according to a particular expression, information defining the expression is not conveyed in the command but is rather stored in RAM 48, and the data and len fields conveyed in the command identify the storage location of the expression information. The invoked procedure acquires this information from memory in the course of executing the command.

The command execution system 74, operating as an additional task within the operating system 70 environment, executes procedures identified by configuration commands stored in queues 104–109, such procedures being executed one at a time according to a predetermined arbitration scheme. Each command is executed by calling a subroutine identified by the command, the subroutine modifying configuration parameters 77 controlling operation of one or more subsystems of steady state and/or hardware subsystems. The command execution system 74 includes a set of command execution modules (subroutines) 112, one for carrying out each type of configuration command, and an arbitrator routine 110 for checking each queue 104–109 according to a predetermined priority system and invoking operation of the appropriate command execution module whenever a command is encountered in one of the queues. If no command is encountered after checking all of the queues, arbitrator operation is suspended until a semaphore 114, a flag maintained by the operating system, is set. Each one of the control interface system 72 subsystems sets semaphore 114 whenever it produces a configuration command for storage in a queue, and when the semaphore is set while arbitrator operation is suspended, operating system 70 "awakens" the arbitrator 110, which rechecks all of the queues for commands, invokes command execution modules 112 as necessary to execute all commands encountered in the queues, and then resets the semaphore 114.

When a command execution module 112 is invoked by arbitrator 110, it may reconfigure one or more selected hardware subsystems by changing configuration control parameters 77 and invoking operation of the appropriate driver 85, 87 and 89 in the interboard communication system 78 as necessary to convey configuration data to the hardware subsystems. A command execution module 112 may also reconfigure one or more of the subsystems of steady state system 76 simply by changing values of appropriate configuration parameters 77. The configuration parameters are monitored by the steady state subsystems, each of which operates continuously during normal oscilloscope operation, and changes in certain configuration parameters automatically result in a change in operation mode of one or more steady state subsystems.

Various command execution modules 112 may be adapted to detect and report errors encountered in the course of attempting to reconfigure oscilloscope hardware or software subsystems, such as for instance errors arising out of inappropriate data in configuration command data fields, or arising out of failure to carry out reconfiguration due to some conflicting prior state of the oscilloscope. When an error is detected, a command execution module may return an error indication to the arbitrator 110, and the arbitrator will store a "Display Message Menu" command in either of a pair of "mailboxes" 116, sections of RAM 48 reserved for transmitting information to human interface management subsystem 92 and to the ASCII interface subsystem 102. This message causes the human interface management subsystem to display an error message on the screen or causes the ASCII interface subsystem to transmit an error message over the RS232 or GPIB buses.

When the command execution module 112 has completed its operation, the arbitrator 110 checks the state of a "done" semaphore in the mailbox 116 of the human interface subsystem 92, and if the flag is not set, it will set the flag and place an "Update" command in the mailbox 116 of the human interface management subsystem. When the human interface management subsystem 92 detects an Update command it updates the menu display to account for any changes in system operating state and resets the done flag. Thus a new Update command is placed in mailbox 116 only when no Update command is already stored therein.

While human interface management subsystem 92 can change the operating state of various steady state and hardware subsystems of the oscilloscope by transmitting configuration commands to the command execution system 74, which in turn adjusts the values of configuration parameters 77, the subsystem controls display of menus on the oscilloscope screen by storing menu display control data in RAM files 79 and invoking display communication driver 89 to cause that data to be sent to the display controller. The display communication driver 89 initially transmits menu display control data to the waveform memory 32 of FIG. 2 for storage therein, and subsequently causes the memory arbitrator 34 to transfer the data to display controller 36. Display controller 36 utilizes this data to create bit maps of menus superimposed over the waveform bit map in display memory 38. Thereafter, when the display controller updates the display on screen 17, the appropriate menus are displayed.

Figure 4:
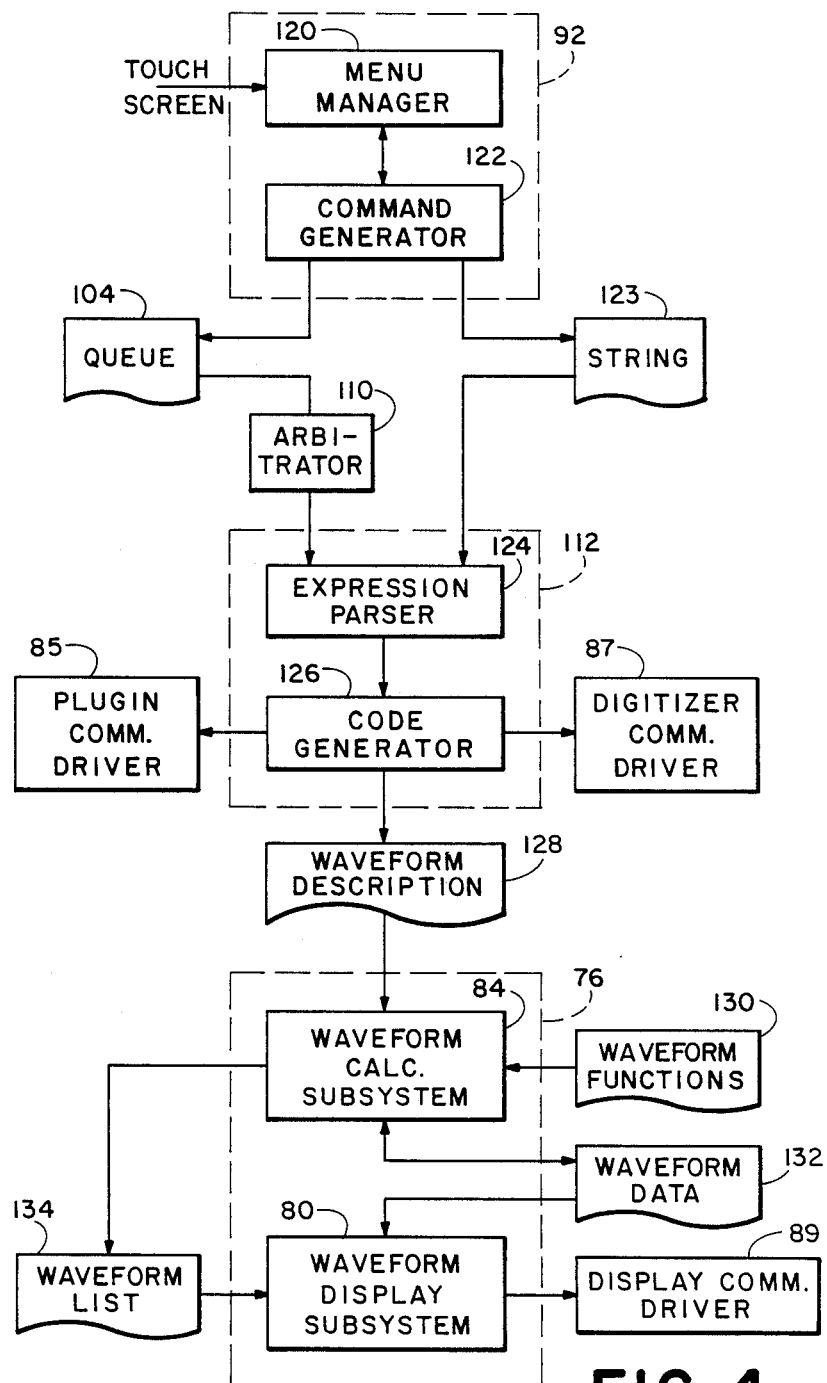
FIG. 4 is a signal flow diagram showing details of an example command generation and execution process utilizing software systems of FIG. 3.

As an example of system operation, the reconfiguration of the waveform calculation subsystem 84 of the steady state system 76 will be discussed. FIG. 4 is a data flow diagram showing the execution of a command produced by the human interface subsystem 92 for configuring the oscilloscope to calculate a waveform according to an expression supplied by a user through menu selections. The human interface subsystem 92 includes a menu manager 120, a subroutine which controls display of various menus on the oscilloscope screen depending on the current operating state of the oscilloscope and responds to menu selections made by the user through the touch screen system. One set of menus displayed by the menu manager enables the user to define an expression for calculating a waveform. For example, one such expression might specify that digitized waveform data representing an input signal applied to one plugin vertical channel be added to digitized waveform data representing an input signal applied to another plugin vertical channel, and the absolute value of the sum be obtained and displayed as a "synthesized" waveform. The synthesized waveform would represent the rectified sum of the two input waveforms.

The menu manager 120 passes information regarding the user's menu selections to a command generator subroutine 122 of the human interface subsystem 92 which provides a data string representing the expression selected by the user. The command generator stores the expression string in a file 123 in RAM 48 of FIG. 2 and stores an appropriate configuration command in queue 104. When the command execution system arbitrator 110 retrieves the command from the queue, it checks the cmdID field in the command and calls a particular command execution module 112 for executing the command identified therein. This particular command execution module determines the RAM storage location of file 123 from the data and len fields of the command, acquires the string stored in file 123, and passes the string to an expression parser routine 124. The parser routine parses the string expression and creates therefrom a set of instructions passed to a code generator routine 126 which configures the plugins and the digitizer so that input signals applied to the selected plugin vertical channels are digitized and so that the resulting waveform data sequences are stored in the waveform memory 32 of FIG. 2. The code generator 126 also stores a set of instructions in a waveform description file 128 for controlling the calculation to be performed according to the user-defined expression.

The waveform description file 128 is accessed by the waveform calculator subsystem 84 which performs the waveform calculation according to the instructions in file 128. These instructions may call subroutines stored in waveform function files 130 maintained in ROM 46 of FIG. 2 for performing such standard operations as finding an absolute value, multiplication, obtaining trignometric functions and the like. In the course of operation, the waveform calculator 84 accesses waveform data files 132 in waveform memory 32 of FIG. 2 to acquire the digitized input waveform data sequence and to store the synthesized waveform data sequence that it calculates. The waveform calculator subsystem 84 can produce several different synthesized waveform data sequences simultaneously, and a waveform list 134 stored in RAM 48 includes references to storage locations of all waveforms currently being synthesized. Waveform calculator 84 adds parameters to waveform list 134 to indicate the location in waveform memory 32 where a new synethesized sequence waveform data is to be stored whenever it begins synthesizing the new waveform. The waveform display subsystem 80 of steady state system 76 monitors the contents of the waveform list 134 and transmits instructions to the display controller 36 and the memory arbitrator 34 of FIG. 2, by way of display communication driver 89, which instructions cause calculated waveform data stored in the waveform memory 32 to be transmitted to the display controller 36 for display as a trace on the screen.

With reference to FIG. 3, the present invention provides a flexible, modular software architecture which permits addition of new hardware and software subsystems and configuration control sources without extensive modification to pre-existing software subsystems. For example, to add a new source of configuration control, it is necessary only to add one additional subsystem to the control interface system 72 for producing configuration commands responsive to the new control source, and to adjust the arbitrator 110 so that it includes commands from the new interface subsystem in its arbitration scheme. It is unnecessary to make changes to any other portion of the software. When a new configuration procedure is to be added, it is only necessary to add a new command execution module and to cause one or more of the control interface system 72 subsystems to produce a command which invokes the new command execution module. None of the preexisting command execution modules need be changed. When a new steady state software or hardware subsystem is added, a command execution module for configuring the new subsystem may be added without having to change any other command execution module. When a steady state software or hardware subsystem is modified, only those command execution modules which configure the modified subsystem need be changed.

The use of queues to store configuration commands until they can be executed permits each of the multiple control sources to generate control signals at any time without conflict and the arbitrator permits stored commands to be executed according to a predetermined order of priority.

While a preferred embodiment of the present invention has been shown and described, it will be apparent to those skilled in the art that many changes and modifications may be made without departing from the invention in its broader aspects. The appended claims are therefore intended to cover all such changes and modifications as fall within the true spirit and scope of the invention.

We claim:

1. An instrument comprising:
    a computer for producing at least one output signal;
    first means for carrying out an instrumentation operation in any one of a plurality of operating modes determined according to said at least one output signal;
    a plurality of control signal sources, each for producing at least one control signal;
    interface means for providing input to said computer indicating when each of said control signal is produced; and
    memory means accessed by said computer for storing a plurality of command execution modules, at least one command execution module comprising instructions for said computer to produce said at least one output signal for determining the operating mode of said first means, said memory means also storing in addition to the command execution modules instructions for causing said computer to generate commands and to store said commands in said memory means as they are generated, each command being generated in response to production of a corresponding one of said control signals indicated by said interface means and each command identifying a corresponding command execution module, and said memory means storing instructions for causing said computer to execute in a predetermined order of priority instructions included in each command execution module identified by each stored command.

2. An instrument comprising:

a computer for producing an output signal;

means for carrying out an instrumentation operation in any one of a plurality of operating modes determined according to said output signal;

a plurality of control signal sources, each producing a control signal;

means for providing an input to said computer indicating when each control signal is produced; and means accessed by said computer for storing configuration parameter data, a steady state module having instructions for said computer to carry out an instrumentation operation in any one of the plurality of operating modes determined according to steady state values of said configuration parameter data, a plurality of command execution modules having instructions for said computer to produce said output signal for determining the operating mode of said carrying out means according to interface values of said configuration parameter data and having instructions for adjusting the steady state values of said configuration parameter data, a command interface module having instructions causing said computer to generate and store commands identifying a corresponding command execution module in response to production of a corresponding one of said control signals indicated by said providing means, and an arbitrator module having instructions for causing said computer to execute in a predetermined order of priority instructions included in each command execution module identified by each stored command.

3. A method for configuring a measurement instrument having a plurality of subsystems for carrying out various operations and having a plurality of control sources comprising the steps of:

converting input control signals from each of the control sources into configuration commands having configuration data;

storing the configuration commands into respective queues associated with each control source;

determining an execution sequence for the stored configuration commands stored in the queues according to a predetermined order of priority; and executing the stored configuration commands in the execution sequence to configure the subsystems for selected modes of operation determined by the configuration commands according to configuration parameters derived from the configuration data.

4. An apparatus for configuring a measurement instrument having a plurality of control sources comprising:

means for converting input control signals from each of the control sources into configuration commands having configuration data;

a plurality of queues, one for each control source, for storing the configuration commands for the converting means;

an arbitrator for determining an execution sequence for the configuration commands stored in the queues according to a predetermined order of priority; and means for executing the execution sequence to configure the measurement instrument including a read only memory having a plurality of command execution modules corresponding one to each configuration command, the command execution module being accessed by the arbitrator according to the execution sequence, and a random access memory having a configuration parameter space in which configuration parameters for the measurement instrument are stored, the accessed command execution module updating the configuration parameter space and configuring the measurement instrument according to the updated configuration parameters.

5. An apparatus as recited in claim 4 wherein the plurality of queues comprise a random access memory having space set aside for each control source to store configuration commands from that control source, the set aside space forming one of the queues.

6. An apparatus as recited in claim 4 wherein the arbitrator comprises a read only memory having a priority determining command sequence stored therein, such priority determining command sequence being accessed prior to each execution of one of the configuration commands to determine the queue from which the configuration command will be executed.

* * * * *